United States Patent
Kohiro et al.

(10) Patent No.: US 8,906,158 B2
(45) Date of Patent: Dec. 9, 2014

(54) METHOD FOR PRODUCING COMPOUND SEMICONDUCTOR EPITAXIAL SUBSTRATE HAVING PN JUNCTION

(75) Inventors: Kenji Kohiro, Tsukuba (JP); Kazumasa Ueda, Tsuchiura (JP); Masahiko Hata, Tsuchiura (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 1746 days.

(21) Appl. No.: 11/660,936

(22) PCT Filed: Aug. 23, 2005

(86) PCT No.: PCT/JP2005/015248
§ 371 (c)(1),
(2), (4) Date: Feb. 23, 2007

(87) PCT Pub. No.: WO2006/022245
PCT Pub. Date: Mar. 2, 2006

(65) Prior Publication Data
US 2009/0031944 A1    Feb. 5, 2009

(30) Foreign Application Priority Data
Aug. 24, 2004 (JP) ................... 2004-243413

(51) Int. Cl.
*H01L 29/861*   (2006.01)
*H01L 29/66*    (2006.01)
*H01L 21/02*    (2006.01)

(52) U.S. Cl.
CPC ......... *H01L 29/861* (2013.01); *H01L 21/02639* (2013.01); *H01L 21/02395* (2013.01); *H01L 21/02579* (2013.01); *H01L 21/02546* (2013.01); *H01L 29/66136* (2013.01)
USPC .................... 117/81; 117/56; 117/83; 438/34

(58) Field of Classification Search
USPC ............. 117/56, 81, 83; 257/E21.222; 438/34
See application file for complete search history.

(56) References Cited

U.S. PATENT DOCUMENTS 5,725,658 A     3/1998  Sawada
6,180,269 B1 *  1/2001  Hagi et al. ............... 428/697

FOREIGN PATENT DOCUMENTS

| JP | 52-037766 A   | 3/1977  |
|----|---------------|---------|
| JP | 5-339100 A    | 12/1993 |
| JP | 8-119800 A    | 5/1996  |
| JP | 11-268998 A   | 10/1999 |
| JP | 2000-103699 A | 10/1999 |
| JP | 2967780 B1    | 10/1999 |
| JP | 2000-103699 A | 4/2000  |
| JP | 2001-053005 A | 2/2001  |
| JP | 2003-257997 A | 9/2003  |

OTHER PUBLICATIONS

Partial transition of Jp 2003-257997.*
Office Action dated Apr. 8, 2011, in corresponding Japanese Application 2004-243413 (in Japanese/English translation).

* cited by examiner

*Primary Examiner* — Bob M Kunemund
(74) *Attorney, Agent, or Firm* — Fitch, Even, Tabin & Flannery LLP

(57) ABSTRACT

Disclosed is a method for producing a compound semiconductor epitaxial substrate having a pn junction by selective growth which is characterized by using a base substrate having an average residual strain of not more than $1.0 \times 10^{-5}$.

14 Claims, 4 Drawing Sheets

(a)

(b)

(c)

(d)

though the high yield and low cost. However, it is known that a
METHOD FOR PRODUCING COMPOUND SEMICONDUCTOR EPITAXIAL SUBSTRATE HAVING PN JUNCTION This Application is the National Phase of International Application No. PCT/JP2005/015248 filed Aug. 23, 2005, which designated the U.S. and was not published under PCT Article 21(2) in English, and this application claims, via the aforesaid International Application, the foreign priority benefit of and claims the priority from Japanese Application No. 2004-243413, filed Aug. 24, 2004, the complete disclosures of which are incorporated herein by reference.

TECHNICAL FIELD

The present invention relates to a method for producing of a compound semiconductor epitaxial substrate having a pn junction.

BACKGROUND ART

In the production of a compound semiconductor epitaxial substrate by allowing each of compound semiconductor layers to epitaxially grow on a base substrate, there is used an epitaxial growth method (hereinafter referred to as "selective growth") that includes a selective growth step wherein a mask comprising $SiO_2$, etc is formed on a functional layer of a compound semiconductor provided on the base substrate and a layer of compound semiconductor is grown on a portion in which the mask is not formed. A compound semiconductor epitaxial substrate having a pn junction (including a p-i-n junction) is produced by this selective growth. By providing electrodes and the like thereon and dividing the resulting devices, compound semiconductor devices such as field-effect transistors (other than schottky junction type) (FETs) and hetero bipolar transistors (HBTs) are produced.

As a base substrate to produce compound semiconductor epitaxial substrates for these compound semiconductor devices, a base substrate which comprises a compound single crystal produced by Liquid Encapsulated Czochralski method (LEC method) is usually used (for example: Patent Document 1).

This LEC method provides a single crystal substrate in high yield and it is low cost. However, it is known that a residual strain in the produced base substrate is $1.2 \times 10^{-5}$-$1.0 \times 10^{-4}$ probably because of a high temperature gradient during the crystal growth of a compound semiconductor (for example: Patent Documents 1 and 2). However, the LEC method is supposed to be sufficient in the production of a compound semiconductor epitaxial substrate produced by selective growth for the device of FETs (other than Schottky junction type) and HBTs and therefore, a base substrate produced by LEC method have been conventionally used in the production.

On the other hand, less lattice defect in compound semiconductor crystal is required, and as a base substrate which is used in the production of a compound semiconductor epitaxial substrate for the production of devices such as a laser diode without recourse to selective growth, further less residual strain is required. Vertical Gradient Freezing method (VGF) and Vertical Bridgman (VB) method were proposed as a production method for that base substrate, and it was known that the residual strain of a base substrate produced by these production methods were about $1 \times 10^{-6}$ to $5 \times 10^{-6}$, which was lower than those of base substrates produced by LEC method (see Patent Document 1). However, the base substrates produced by VGF method and VB method had not been used for production of a compound semiconductor epitaxial substrate having a pn junction by selective growth because the initial electric characteristics of devices such as FETs (other than Schottky junction type) and HBTs were not remarkably improved and the costs of these methods were higher than those of LEC method.

It is known that a compound semiconductor device produced from a compound semiconductor epitaxial substrate having a pn junction by selective growth has problems of occurring of characteristics deterioration with use for a long time, so improvement of the problems had been demanded.

Patent Document 1: JP 11-268998 A
Patent Document 2: JP 5-339100 A

DISCLOSURE OF INVENTION

Problem to be Solved by the Invention

An object of the present invention is to provide a method for producing a compound semiconductor epitaxial substrate having a pn junction by epitaxial growth method including a selective growth step, which can provide a compound semiconductor epitaxial substrate for a compound semiconductor device whose characteristics deterioration hardly occurs.

Means for Solving the Problem

To solve the above problem, the present inventors devoted themselves to and discussed a method for producing a component semiconductor epitaxial substrate having a pn junction by selective growth. As a result, they focused on the residual strain of a base substrate to allow a compound semiconductor layer to grow thereon, and found that a component semiconductor epitaxial substrate having a pn junction for a component semiconductor device whose characteristics deterioration hardly occurs can be produced when the average residual strain is not more than a certain value. They thus have accomplished the present invention.

That is, the present invention provides a method for producing a compound semiconductor epitaxial substrate having a pn junction by selective growth, characterized by using a base substrate having an average residual strain of not more than $1.0 \times 10^{-5}$.

Advantages of the Invention

The production method of the present invention relates to producing a component that is suitable for production of devices such as field-effect transistors (other than schottky junction type) and hetero bipolar transistors because the characteristics deterioration of compound semiconductor devices hardly occur in case of using a compound semiconductor epitaxial substrate for the devices, and this is very useful in industry.

BEST MODE FOR CARRYING OUT THE INVENTION

Figure 1:
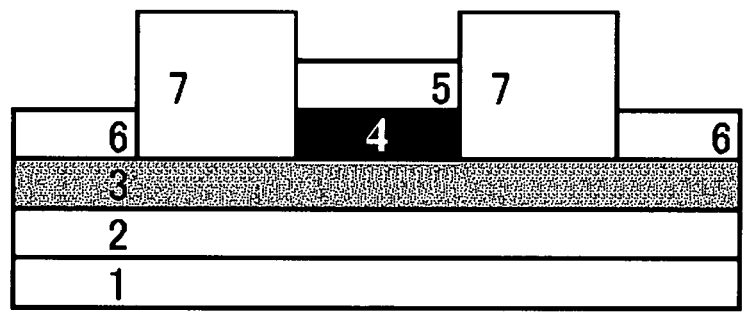
FIG. 1 shows a layered structure of a diode as an example of the mode of carrying out the present invention.

The production method of the present invention is characterized by using a less strained base substrate whose average residual strain is not more than $1.0 \times 10^{-5}$.

The present inventors found that, for example, the initial electric characteristics of a compound semiconductor device which was produced by using a component semiconductor epitaxial substrate having a pn junction produced by selective growth, which was produced by using a base substrate whose residual strain is low level, which was produced by VGF method or VB method did not remarkably increase, but the deterioration of the compound semiconductor device after use for a long time was decreased.

In selective growth, after a part of compound semiconductor layers which constitute a compound semiconductor device is epitaxially grown on a substrate, a mask made of $SiO_2$, etc. is created on or above the grown layer(s), after that, another compound semiconductor layer is grown epitaxially, and then a compound semiconductor device is produced by providing electrodes. Probably, it is speculated that a thermal stress is generated due to difference in coefficient of thermal expansion between the compound semiconductor layer formed by epitaxial growth and the $SiO_2$ mask when the temperature increases during the epitaxial growth of another compound semiconductor layer, or when the temperature decreases after the epitaxial growth, so that the thermal stress is added to the stress by the residual strain and accelerates the increase of dislocation, which leads to the deterioration of the devices. It is thought that the deterioration of devices by use for a long time becomes low because the dislocation decreases in case of using a substrate which has little residual strain, which is produced for example, by VGF method or VB method.

Average residual strain of a substrate used in this invention is not more than $1.0 \times 10^{-5}$. In case of using a substrate whose average residual strain is more than $1.0 \times 10^{-5}$, there is a possibility of progress of deterioration of a compound semiconductor device by use for a long time. The average residual strain is preferably not more than $7 \times 10^{-6}$ and more preferably not more than $5 \times 10^{-6}$.

For the growth of a compound semiconductor layer, Metal Organic Chemical Vapor Deposition (MOCVD) method and Molecular Beam Epitaxy (MBE) method are usually used. In each method, a compound semiconductor layer is grown by heating a base substrate at 300 to 700° C. and then a mask of $SiO_2$, etc. is formed, further the remaining layers of compound semiconductor are grown, and finally a compound semiconductor epitaxial substrate is obtained.

In the present invention, the residual strain of a compound semiconductor epitaxial substrate can be measured by, for example, photoelasticitics method. More specifically, it can be measured for example by a method described in Proceedings of 8th Semi Insulation III-V Materials, Warsaw Poland June, 1994, p 95-98.

The photoelasticitics method is for observation of situation of stress concentration by using a double refraction phenomenon and it is usually used in the art. The residual strain of a substrate is an absolute value of a difference between strain (Sr) in the radial direction and that (St) in the tangent line direction, which is calculated in following equation.

$$|Sr-St| = k\delta/[(\cos 2\phi/P_{11}-P_{12})^2 + (\sin 2\phi/P_{44})^2]^{1/2}$$

wherein $k = (\lambda/\pi d n_0)^3$ (In this equation, $\lambda$ is a wave length of a light used in the measurement, d is a thickness of a substrate, n0 is an index of refraction of a substrate, $\delta$ is a difference in phase generated by double refraction, $\phi$ is a principal vibration-angle direction, $P_{11}$, $P_{12}$ and P44 are photoelasticitics constant components in elastic tensor.)

An example of the mode for carrying out the present invention is explained below in detail with referring to some figures. These figures are no more than one example of the mode for carrying out the present invention, and the present invention should not be limited by this structure of compound semiconductor device.

FIG. 1 shows that one embodiment of compound semiconductor device which is produced by using a compound semiconductor epitaxial substrate by the method of the present invention, wherein the compound semiconductor device is a diode. In FIG. 1, numeral 1 is a semi-insulating GaAs substrate, numeral 2 is a buffer layer and numeral 3 is an $n^+$GaAs layer. The upper part of the $n^+$GaAs is provided with insulating $SiO_2$ film 7. $p^+$GaAs layer 4 is provided on an apertural area, in addition, p electrode 5 is provided on the $p^+$GaAs layer and n electrode 6 on the $n^+$GaAs layer, both by sputtering.

Figure 2:
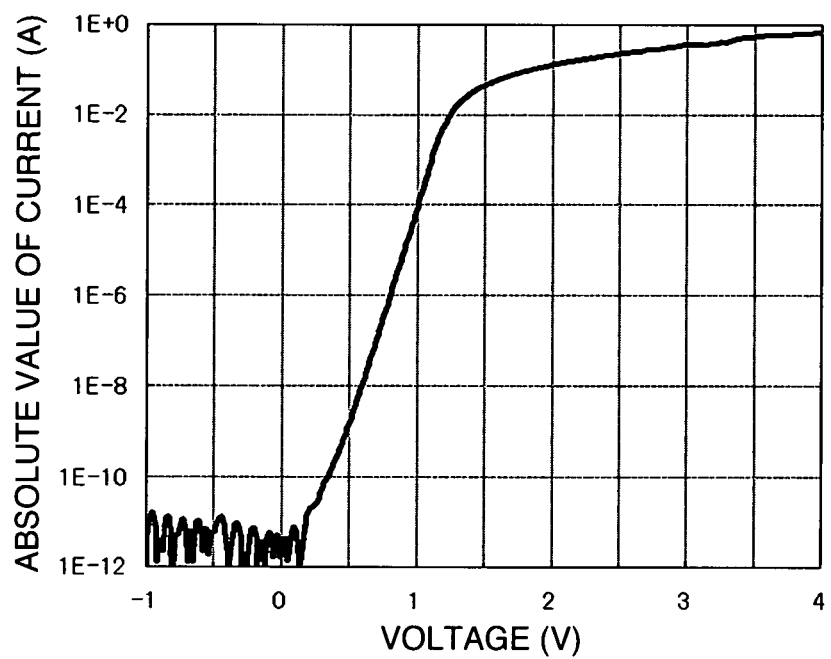
FIG. 2 is a graph to explain the characteristics of current-voltage of a diode.
Figure 3:
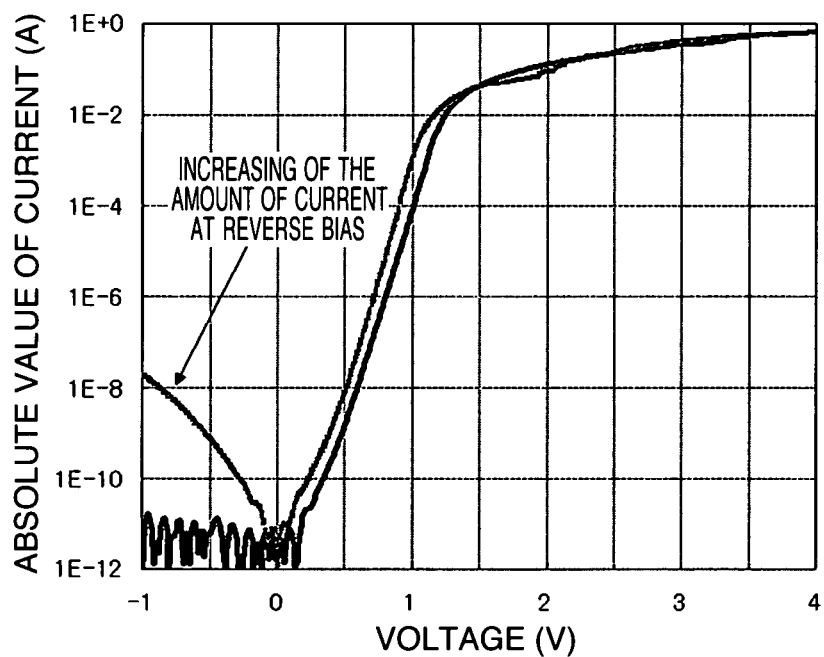
FIG. 3 is a graph to show a deterioration of a diode after keeping current.

FIG. 2 shows a graph explaining characteristics of current and voltage of this diode. Current hardly passes through this diode in reverse bias and shows rectification. However, when the diode deteriorates after use for a long time, the amount of current increases in reverse bias as shown in FIG. 3. In the compound semiconductor device of the present invention, in case of a diode, the increase of current is little in reverse bias like this, so that the characteristics of current-voltage are shown in FIG. 2, and the deterioration is low.

An embodiment of a diode was explained above. In other devices having a pn junction, for example, in a junction type of field-effect transistor (JFET), hetero bipolar transistor (HBT) and the like, the degradation of characteristics of current amplification factor ($\beta$) and maximum current (Imax) and the like is less in a compound semiconductor device produced by using a compound semiconductor epitaxial substrate according to the present invention as compared to those of the conventional devices.

EXAMPLES

The present invention is explained in more detail with reference to examples, but the present invention should not be limited by these examples.

Example 1

A diode having a layered structure shown in FIG. 1 was prepared as follows.

Figure 4:
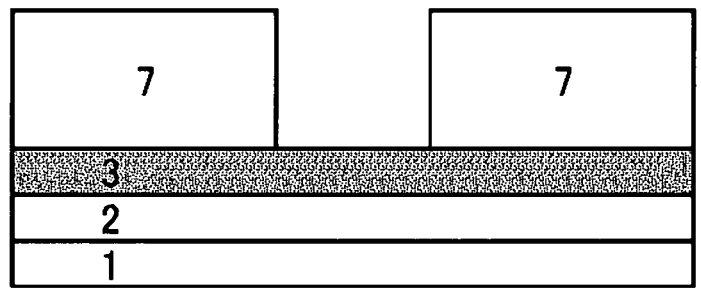
FIG. 4 shows a production process for a device having a pn junction of FIG. 1.
Figure 4:
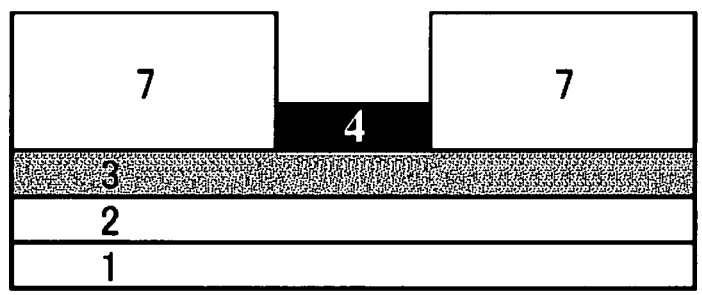
Figure 4:
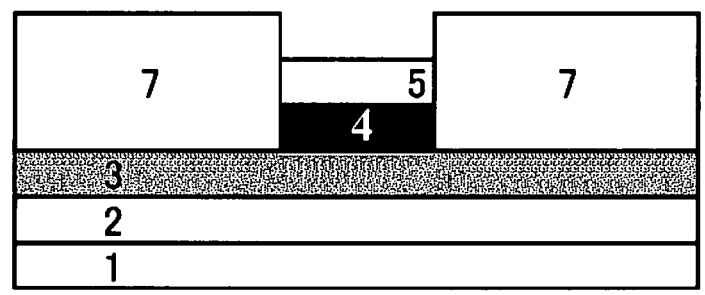
Figure 4:
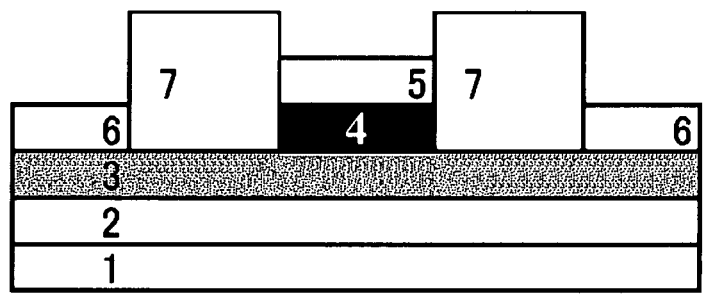
Figure 6:
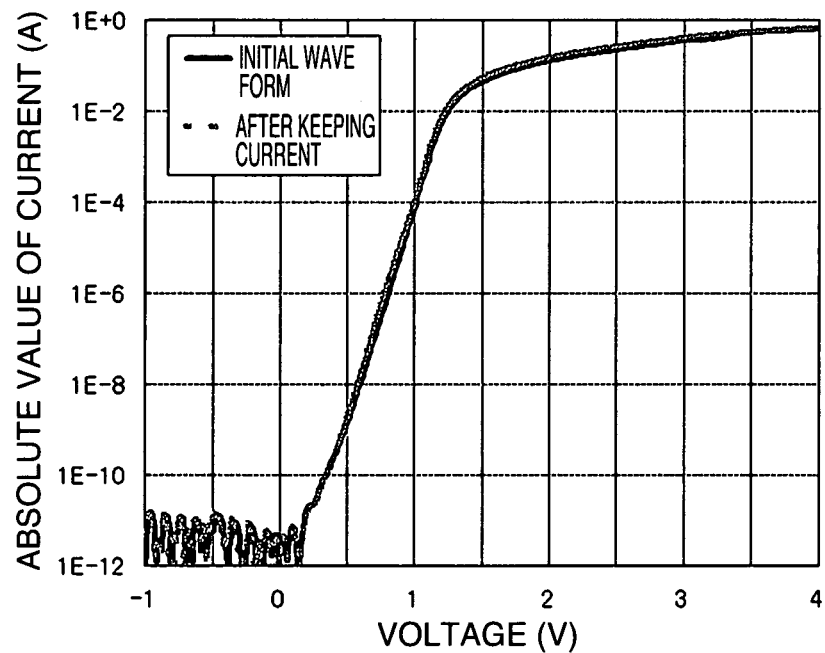
FIG. 6 shows a graph to show no deterioration after keeping current of the diode of Example 1.

Buffer layer 2 and $n^+$GaAs layer 3 were prepared by MOCVD in order on semi-insulating GaAs substrate 1 whose average residual strain was $2 \times 10^{-6}$. Then, $SiO_2$ insulating film 7 was deposited on all over an epitaxial substrate, followed by patterning by using a photo resist as a mask, and $SiO_2$ insulating film present at the area where $p^+$GaAs would be formed was opened (FIG. 4(a)). Then, $p^+$GaAs layer 4 was grown selectively on this open area by MOCVD method (FIG. 4(b)). In addition, after p electrode 5 was formed by deposition on $p^+$GaAs layer 4 by sputtering (FIG. 4(c)), $SiO_2$ insulating film where n electrode would be formed was opened by using a photo resist as a mask, and n electrode 6 was formed (FIG. 4(*d*)).

Figure 5:
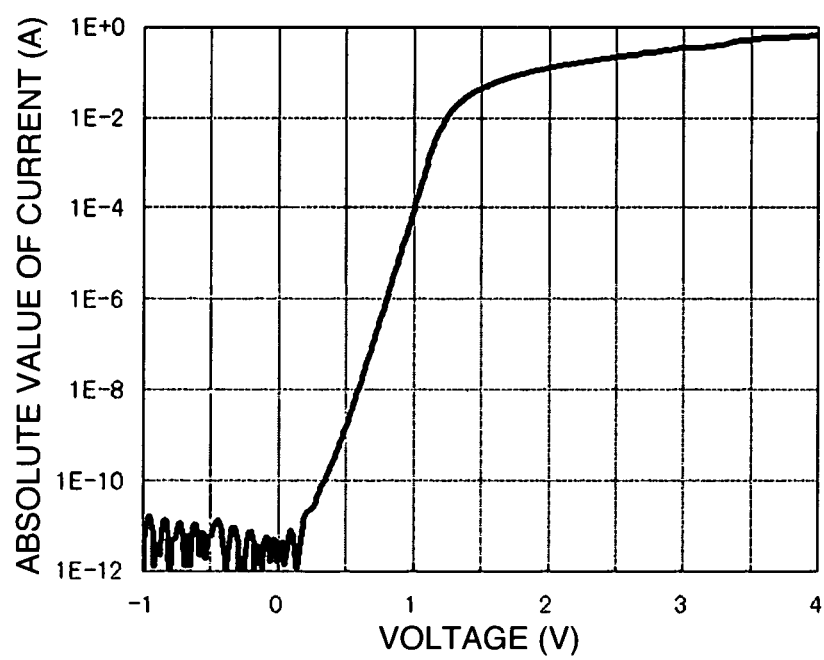
FIG. 5 is a graph to show characteristics of current-voltage of a diode.

Characteristics of current-voltage of the compound semiconductor device (diode) obtained as described above are shown in FIG. 5. An accelerated deterioration test was conducted by applying an excessive voltage of 3.7V to this device and keeping electricity for 10 minutes. After that, the characteristics of current-voltage was measured and then increasing of leak current of reverse bias was hardly seen. No dislocation was observed by TEM (transmission electron microscope) at the section of the device after the keeping of electricity.

Example 2

A diode was produced under the same conditions as in Example 1 except for using GaAs substrate which was produced by VB method and whose average residual strain produced was $4\times10^{-6}$. As a result, the deterioration of the device (such as increasing of reverse bias current) was hardly observed in the same way as in Example 1, and no generation of dislocation was observed.

Comparative Example 1

Figure 7:
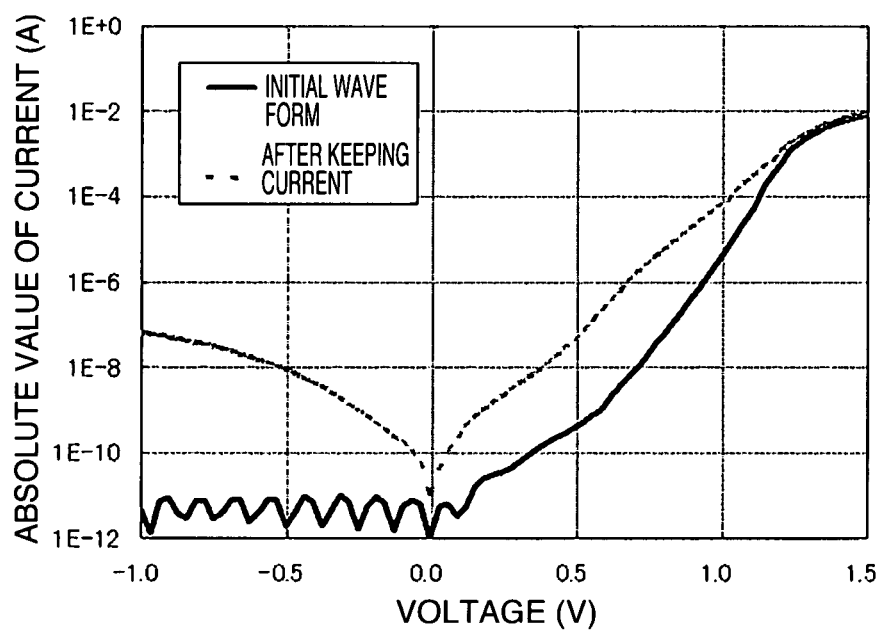
FIG. 7 shows a graph to show a deterioration after keeping current of the diode of Comparative Example 1.

A diode was produced under the same conditions as in Example 1, except for using a GaAs substrate which was produced by LEC method and whose average residual strain was $4\times10^{-5}$. As a result, reverse bias leak current increased as shown in FIG. 7 and a large amount of dislocation were observed by TEM (transmission electron microscope) at the section of the device after keeping current.

The invention claimed is:

1. A method for producing a compound semiconductor epitaxial substrate having a pn junction by selective growth characterized by using a base substrate having an average residual strain of not more than $1.0\times10^{-5}$, wherein said base substrate is a GaAs substrate, a p-type electrode is formed on the p layer of said pn junction, and a n-type electrode is formed on the n layer of said pn junction, wherein said method comprises:
    (1) epitaxially growing at least one compound semiconductor layer on or above said base substrate;
    (2) forming a masking layer on or above at least one compound semiconductor layer formed in (1) and patterning using said masking layer;
    (3) epitaxially growing another compound semiconductor layer;
    (4) forming said p type electrode on the p layer of said pn junction and forming said n-type electrode on the n-type layer of said pn junction,
    wherein said pn junction is formed during the performance of steps (1)-(3).

2. The method according to claim 1, wherein said base substrate is one produced by VGF method or VB method.

3. The method according to claim 1, wherein the base substrate has an average residual strain of not more than $7.0\times10^{-6}$.

4. The method according to claim 1, wherein the base substrate has an average residual strain of not more than $5.0\times10^{-6}$.

5. The method according to claim 1, wherein the base substrate has an average residual strain of $4\times10^{-6}$.

6. The method according to claim 1, wherein the method includes in (1) forming a buffer layer on said base substrate.

7. The method according to claim 1, wherein the method further comprises depositing an insulating film before forming the masking layer in (2).

8. The method according to claim 1, wherein in (2) a photo resist is used as a mask in said patterning.

9. The method according to claim 1, wherein in (3) the another compound semiconductor layer comprises p+GaAs.

10. The method according to claim 1, wherein in (4) the electrodes are formed by sputtering.

11. A method for producing a compound semiconductor epitaxial substrate having a pn junction by selective growth characterized by using a base substrate having an average residual strain of not more than $1.0\times10^{-5}$, wherein said base substrate comprises a semi-insulating GaAs substrate, a p-type electrode is formed on the p layer of said pn junction, and a n-type electrode is formed on the n layer of said pn junction, wherein said method comprises:
    (1) epitaxially growing at least one compound semiconductor layer on or above said base substrate;
    (2) forming a masking layer on or above at least one compound semiconductor layer formed in (1) and patterning using said masking layer;
    (3) epitaxially growing another compound semiconductor layer;
    (4) forming said p type electrode on the p layer of said pn junction and forming said n-type electrode on the n-type layer of said pn junction,
    wherein said pn junction is formed during the performance of steps (1)-(3).

12. The method according to claim 11, wherein the base substrate has an average residual strain of not more than $7.0\times10^{-6}$.

13. The method according to claim 11, wherein the base substrate has an average residual strain of not more than $5.0\times10^{-6}$.

14. The method according to claim 11, wherein the base substrate has an average residual strain of $4\times10^{-6}$.

* * * * *